United States Patent [19]
Moran et al.

[11] Patent Number: 5,917,708
[45] Date of Patent: Jun. 29, 1999

[54] EMI SHIELD APPARATUS FOR PRINTED WIRING BOARD

[75] Inventors: Sean A. Moran; Jose F. Olivas; Thomas J. Chintala, all of San Diego, Calif.

[73] Assignee: Qualcomm Incorporated, San Diego, Calif.

[21] Appl. No.: 08/823,773

[22] Filed: Mar. 24, 1997

[51] Int. Cl.⁶ ............................... H05K 7/00; H05K 9/00
[52] U.S. Cl. ..................... 361/800; 361/816; 174/35 R
[58] Field of Search ................................ 361/816, 818, 361/800; 174/35 R, 35 CG

[56] References Cited

U.S. PATENT DOCUMENTS

| | | | |
|---|---|---|---|
| 4,370,515 | 1/1983 | Dondldson | 361/818 X |
| 4,816,613 | 3/1989 | Ito et al. | 174/35 R |
| 4,837,664 | 6/1989 | Rodriguez et al. | 361/816 X |
| 4,903,169 | 2/1990 | Kitagawa et al. | 361/818 |
| 5,412,340 | 5/1995 | Tanikoshi | 361/818 X |
| 5,436,802 | 7/1995 | Trahan et al. | 361/816 |
| 5,633,786 | 5/1997 | Matuszewski et al. | 361/818 X |

*Primary Examiner*—Leo P. Picard
*Assistant Examiner*—Jayprakash N. Gandhi
*Attorney, Agent, or Firm*—Russell B. Miller; Charles D. Brown; Roger W. Martin

[57] ABSTRACT

An EMI shielding apparatus has an outer peripheral wall extending around a combined area of predetermined shape and dimensions for enclosing at least two adjacent areas on a printed wiring board to be shielded from one another. A single transverse wall extends between opposing portions of the peripheral wall to divide the combined area into the two adjacent sub-areas to be shielded from one another. The single transverse wall is of single wall thickness, reducing the EMI shield footprint. The peripheral wall and transverse wall may be formed integrally as one frame, or from two or more adjacent sub-frames.

14 Claims, 2 Drawing Sheets

EMI SHIELD APPARATUS FOR PRINTED WIRING BOARD

CROSS-REFERENCES TO RELATED APPLICATIONS

This application is related to a co-pending application entitled "Brace Apparatus and Method for Printed Wiring Board Assembly" of the same inventors, filed on even date herewith.

BACKGROUND OF THE INVENTION

I. Field of the Invention

The present invention relates generally to printed wiring boards, and is particularly concerned with an EMI (electromagnetic interference) shield apparatus for printed wiring boards to shield components on the board from noise emanating from other components.

II. Description of the Related Art

EMI shields are generally rectangular frames with an integral or separate cover. The frames are placed at appropriate positions on a printed wiring board during assembly in order to enclose areas containing components to be shielded from one another. Typically, dots of solder material are placed on the board surrounding rectangular areas containing components to be shielded, and the EMI shields or frames are seated onto the dots. The assembly is then passed through a reflow oven to soften the solder material and adhere the EMI shields to the board. In a typical layout, several rectangular shields will be placed on the board, each having one or more walls in face to face engagement with a wall of an adjacent shield. One problem with such arrangements is the footprint or area taken up by the EMI frames, particularly with the current tendency towards smaller and smaller printed wiring boards.

SUMMARY OF THE INVENTION

It is an object of the present invention to provide a new and improved EMI shielding apparatus for a printed wiring board.

According to the present invention, an EMI shielding apparatus is provided which comprises an outer, rectangular frame for enclosing at least two adjacent areas on a printed wiring board to be shielded from one another, the frame having a peripheral wall defining a combined area to be enclosed, and a single transverse wall extending between opposing portions of the peripheral wall to divide the combined area into two adjacent sub-areas to be shielded from one another, the transverse wall being of single wall thickness.

In one embodiment of the invention, the outer peripheral wall and transverse wall are integrally formed as a one-piece frame. In another embodiment, the outer frame is formed from two sub-frames, each having three side walls forming part of the outer peripheral wall, and a fourth partial wall which engages with the partial wall of the other sub-frame to form the transverse wall when the two sub-frames are placed side-by-side. Thus, one frame has a first partial wall on one side of one of the frames extending in a first direction and the other frame has a second partial wall on an opposite side of the other frame extending in the opposite direction to the first partial wall. The two frames are then positioned with the partial side walls facing one another, and moved to align the partial sidewalls to form a continuous wall separating the areas enclosed by the frames.

In a third alternative, the outer frame is also formed from two sub-frames, a first one of which has three side walls and a second of which has four side walls, with the two sub-frames placed side by side so that the open side of the first sub-frame abuts against a first side wall of the second sub-frame, so that the first side wall forms the transverse wall separating the combined area enclosed by the two sub-frames into two separate sub-areas.

Clearly, the outer periphery of the frame may be designed to surround three or more areas of a board to be shielded, if desired, and may be formed in one piece with two or more spaced transverse walls, or in separate frames which each have a partial wall for placing against a partial wall of another frame to separate two adjacent areas. Alternatively, three or more frames may be provided with one frame having four walls and the rest having three walls, with the open side of a first three wall frame being placed against one side wall of the four wall frame, and the open sides of the or each other three wall frame being placed up against a wall of an adjacent frame to enclose all desired areas.

Preferably, in the embodiments where the frame is made in two or more separate parts, a one-piece cover is provided for placing over the parts when they are positioned side by side on a printed wiring board, so as to hold the parts together during reflow. The cover is removed after reflow is complete.

This arrangement saves space on printed wiring boards. Previously two separate frames, each having a four-sided periphery, were placed side-by-side on a printed wiring board so that two adjacent sides were in face-to-face engagement. This produces a double thickness wall separating each adjacent pair of areas to be shielded. With the present invention, such double walls are replaced with a single, shared wall, taking up less space on the board. This reduces the physical footprint of the EMI shield.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
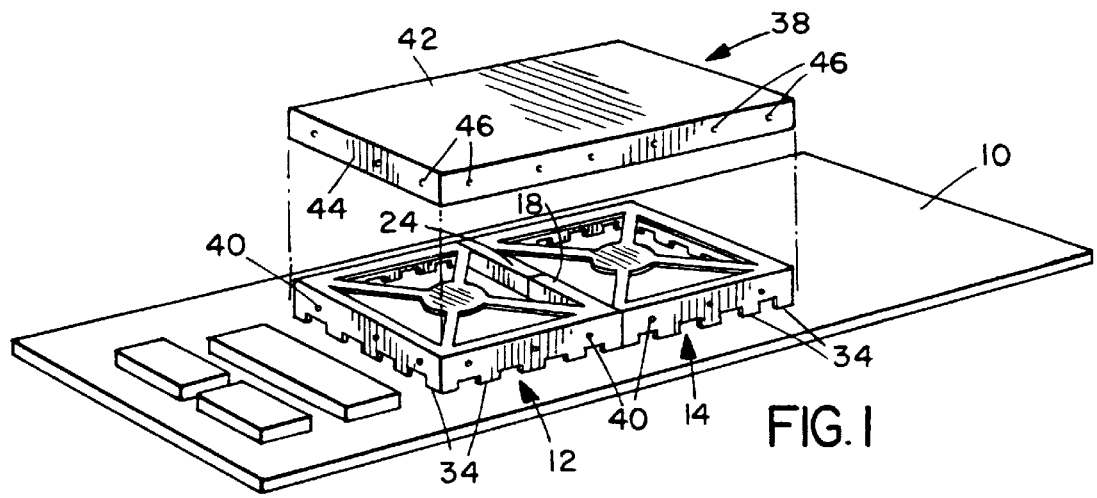
FIG. 1 illustrates a typical circuit board with a shielding apparatus according to a first embodiment of the invention in place and showing a retaining cover removed.
Figure 2:
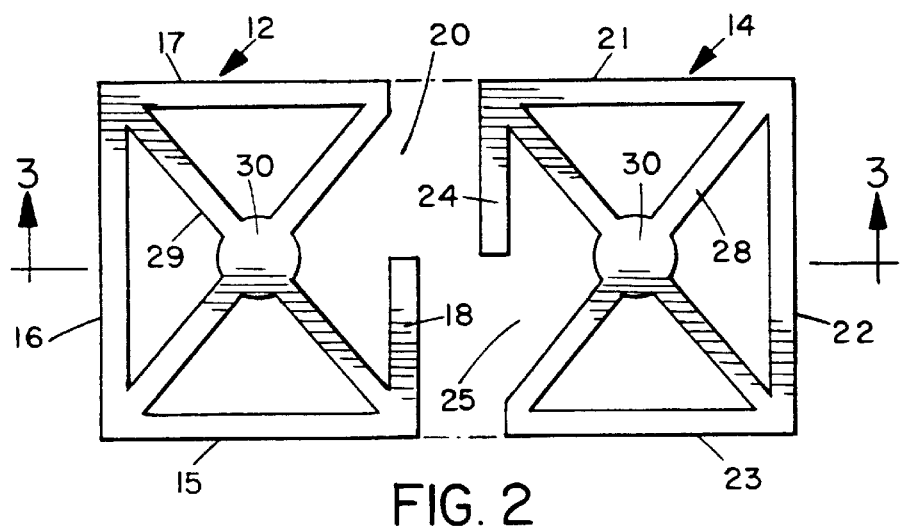
FIG. 2 is an enlarged top plan view of the two shield units separated.
Figure 3:
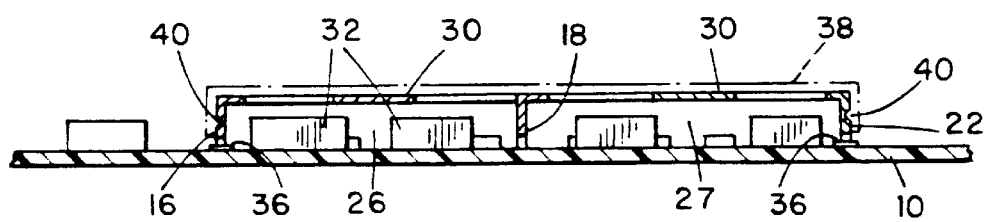
FIG. 3 is a sectional view taken on line 3—3 of FIG. 2, showing the positioning on the circuit board.

FIGS. 1 and 3 of the drawings illustrate a two part shield apparatus according to a first embodiment of the present invention installed on a printed wiring board 10, while FIG. 2 illustrates the two parts 12,14 of the shield apparatus separated prior to assembly.

In the embodiment of FIGS. 1 to 3, the first part 12 of the shield apparatus comprises a first, rectangular frame having three full side walls 15,16,17 and a half side wall 18 on the right hand side of the frame, leaving a gap 20 in side wall 18. The second part 14 of the shield apparatus comprises a second, rectangular frame having three full side walls 21,22, 23 and a half side wall 24 on the left hand side of the frame, extending in the opposite direction to side wall 18 of the first frame, and leaving a gap 25 in side wall 24.

The two frames, each of which has three and one half side walls, are placed side by side as indicated in FIG. 2, so that gap 20 is aligned with half wall 24 and gap 25 is aligned with half wall 18. The two frames can then be abutted so that the half wall 18 aligns with half wall 24 to form a complete wall separating two adjacent enclosed areas 26 and 27, as best illustrated in FIGS. 1 and 3. Unlike prior art arrangements, the single transverse wall formed by abutting half walls 24 and 18 is only a single wall thickness, rather than a double wall thickness, and takes up less room on the board than prior art arrangements of separate, four-walled frames.

Each frame 12,14 also has a cross web structure extending across its upper open face, with two diagonal cross webs 28,29 and an enlarged circular pad 30 at the center. This pad forms a pick-up area for an optical pick-and-place machine for positioning the frame at a predetermined position on board 10 so as to shield components 32 on the board from one another, as will be understood by those skilled in the field. Alternatively, each frame 12,14 may have an integral, continuous upper wall.

Each of the frames 12,14 also has conventional castellations 34 along its lower edge for seating on solder pads 36 on the printed wiring board 10, as best illustrated in FIGS. 1 and 3. Preferably, a one piece, rectangular lid or cover member 38 of shape and dimensions matching the combined dimensions of both frames 12 and 14 is provided for fitting over the frames and holding them together during reflow. This is similar to the brace apparatus as described in our co-pending application filed on even date herewith, entitled "Brace Apparatus and Method for Printed Wiring Board Assembly", the contents of which are incorporated herein by reference. The three outer side walls 15,16,17 and 21,22,23 of the two frames are each provided with a series of spaced indents 40. Cover member 38 has a top wall 42 and downwardly depending rim 44 with a series of spaced protrusions 46 on its inner face for releasable snap engagement in indents 40. The cover member may be left in place after reflow is complete to shield the components, or may be removed. If left in place, it is readily removable to permit access to the components 32 within the frames for testing or maintenance.

Although in the illustrated embodiment two separate frames 12,14 are mated together to enclose two adjacent sub-areas 26,27 on the board and separate those areas with a combined cross wall 18,24, a similar arrangement may be used to enclose three or more adjacent sub-areas, by adding further partial frames alongside any of the outer side walls of the first two frames, with the respective outer side wall being made a half or partial wall and mating with a corresponding half wall on the additional frame in the same manner as walls 18 and 24 in the illustrated embodiment. In this case, one or more of the frames would have two full side walls and two partial walls. The cover member 38 would then be extended to cover all of the frames. This arrangement significantly reduces the footprint of EMI shields, since the wall separating adjacent sub-areas is only a single wall thickness rather than a double wall thickness. Thus, available area on the board for receiving components is increased.

Figure 4:
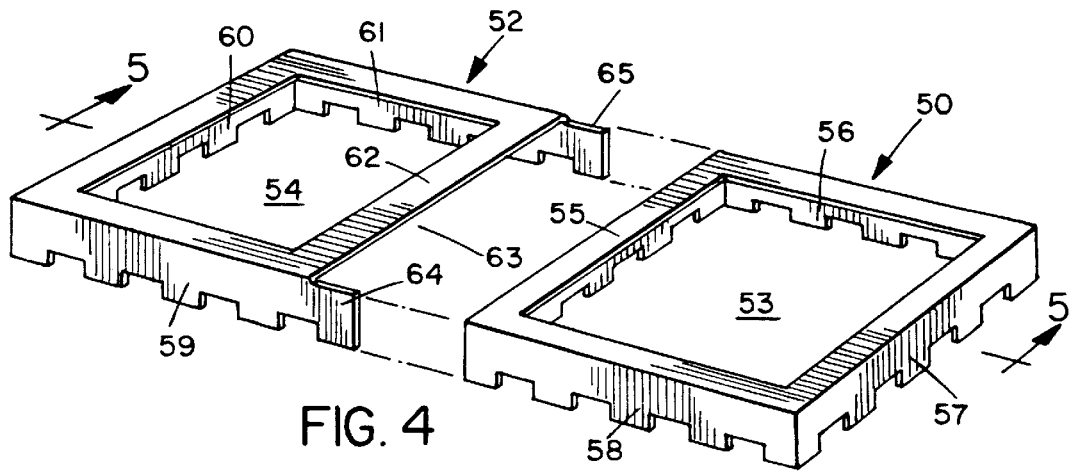
FIG. 4 is a perspective view of an alternative dual shield.
Figure 5:
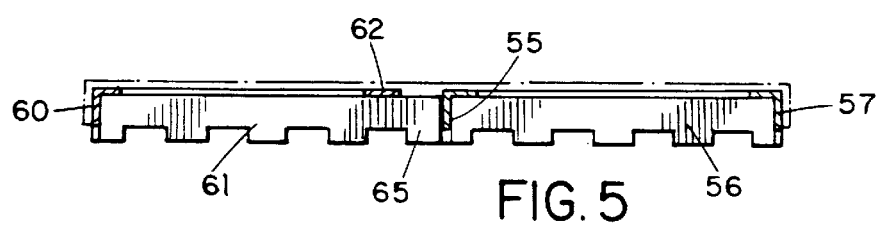
FIG. 5 is a sectional view taken on line 5—5 of FIG. 4, with the shield units joined.

FIGS. 4 and 5 illustrate an alternative embodiment in which two frames 50,52 are placed side-by-side on a board to separate two adjacent areas 53,54. In this case, rather than two, three and one half sided frames as in the previous embodiment, one of the frames 50 has four full side walls 55,56,57,58, while the other frame 52 has only three side walls 59,60,61. An upper web 62 extends across the open side 63 of frame 52 for added strength and rigidity. Web 62 may have a downturned edge portion for added rigidity, if desired. The open side 63 of frame 52 is arranged to butt up to one of the side walls of the full frame 50, for example side wall 55 as illustrated in FIGS. 4 and 5.

Preferably, the side walls 59,61 on opposite sides of the open side 63 of frame 52 have projecting portions 64,65, respectively, which extend forwardly from upper web 62. Frame 50 is butted up against the projecting portions 64,65 of frame 52, as indicated in FIGS. 4 and 5. As in the previous embodiment, with this arrangement only a single wall thickness, i.e. the thickness of wall 55, separates the two adjacent enclosed areas 53 and 54, reducing the EMI shield footprint on the printed wiring board.

As in the previous embodiment, the lower edges of the side walls of each frame have conventional castellations 34 for seating on solder pads on the board (not illustrated). Also as in the previous embodiment, a removable cover member will be provided for fitting over both frames 50,52 during reflow. The cover member will be identical to cover member 38 of the previous embodiment, and may be removed or left in place after reflow. The frames 50 and 52 will also be provided with suitable pads or contact areas for a vacuum pick up head of an optical pick-and-place machine, for example webs and contact pads 30 as in the previous embodiment, or a continuous upper wall on each frame.

FIGS. 4 and 5 illustrate an arrangement for enclosing two adjacent areas on a board containing components to be shielded from one another. It will be understood that this embodiment can be extended to three or more adjacent areas, by suitable addition of three sided frames to butt up against side walls of either frame 50 or 52, depending on the arrangement of areas on the board to be shielded. If three adjacent areas in a line are to be shielded, an additional three sided frame identical to frame 52 may have an open side butted up against wall 57 of frame 50 or wall 60 of frame 52, for example. If an L-shaped total enclosure is to be formed, an additional three sided frame identical to frame 52 may have an open side butted up against side wall 56 or 58 of frame 50, or side wall 59 or 61 of frame 52. In a similar manner, additional three wall frames may be placed adjacent any one of the first three to enclose four or more adjacent areas in any desired pattern, depending on component placement on a printed wiring board. Each pair of adjacent areas will be separated by only a single wall thickness, rather than a double wall thickness as was previously the case where adjacent four walled frames were conventionally used.

Figure 6:
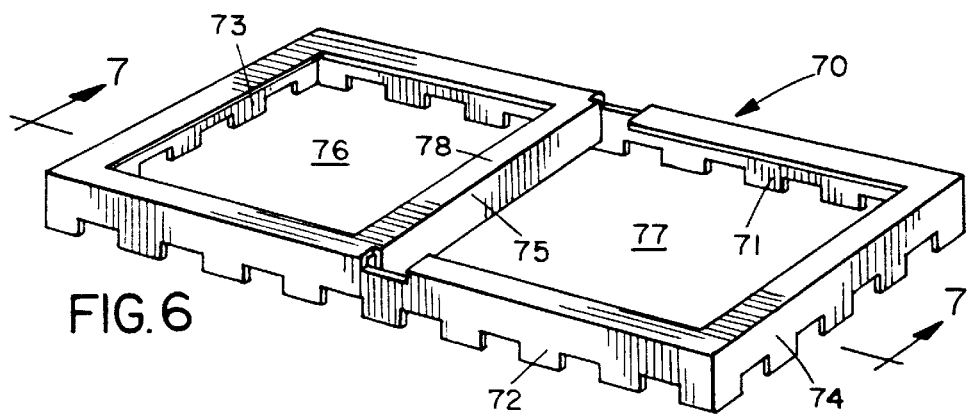
FIG. 6 is a perspective view of a further alternative dual unit.
Figure 7:
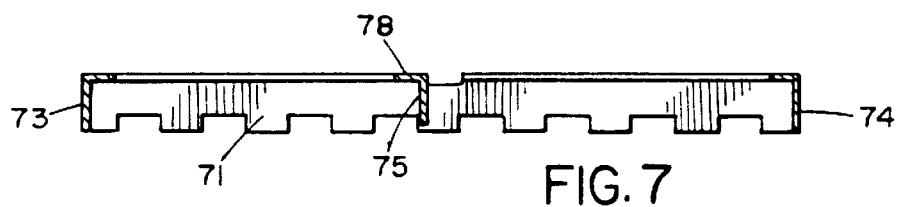
FIG. 7 is a sectional view taken on line 8—8 of FIG. 6.

FIGS. 6 and 7 of the drawings illustrate a third embodiment of the invention, where a single frame 70 is used in place of two or more separate frames as in the previous embodiments. Frame 70 is of rectangular shape, having parallel side walls 71 and 72 and parallel end walls 73,74, and a single transverse wall 75 extending between side walls 71,72 to separate the area enclosed by the frame into two adjacent sub-areas 76,77. Transverse wall 75 is formed by manufacturing the frame 70 with a top web extending between opposing side walls 71,72, and then cutting out and bending down half of the web to form wall 75, leaving top web 78 extending between the side walls.

As in the previous embodiments, a suitable cross web structure or top wall (not illustrated) will be provided for forming a pick-up area for a vacuum or suction head of an optical pick-and-place machine for picking up the frame 70 and suitably positioning it on solder pads on a printed wiring board, as described above in connection with the first embodiment. A removable cover may also be provided for engaging over the frame to protect the underlying components, in a similar manner to cover 38 of the first embodiment, although in this case the cover is not needed to hold any frames together since the frame is formed integrally in one piece.

In the illustrated embodiment, frame 70 is designed to enclose two adjacent areas 76,77 on a board. It will be understood that the frame 70 may be extended as needed to enclose three or more adjacent areas, simply by enlarging the dimensions of the frame to cover all areas to be shielded, and forming additional transverse walls 75 as needed between adjacent areas to be shielded from one another. As in the previous embodiments, only a single wall thickness separates each adjacent pair of areas, providing a similar reduction in the footprint of the EMI shield apparatus.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A printed wiring board assembly, comprising:

a printed wiring board;

a plurality of components mounted on the printed wiring board;

an EMI shielding apparatus mounted on the board to enclose at least two predetermined, adjacent areas on the board so as to shield components in each one of said areas from components outside said one area;

the shield apparatus having an outer, peripheral wall enclosing both of the adjacent areas, the peripheral wall including opposing wall portions on opposite sides of a dividing line between the adjacent areas;

a single transverse wall extending between said opposing portions of the peripheral wall along said dividing line to divide the combined area into two adjacent sub-areas to be shielded from one another, the transverse wall being of single wall thickness;

the outer peripheral wall and transverse wall being integrally formed as a one-piece frame; and the peripheral wall of the frame having an upper edge and a lower edge and comprising a pair of continuous side walls and a pair of end walls, the frame having an upper, horizontal flat web extending between opposing portions of the upper edges of the side walls, the web having a downturned portion comprising said transverse wall.

2. A printed wiring board assembly, comprising:

a printed wiring board;

a plurality of components mounted on the printed wiring board;

an EMI shielding apparatus mounted on the board to enclose at least two predetermined, adjacent areas on the board separated along a predetermined dividing line so as to shield components in each one of said areas from components outside said one area;

the shield apparatus comprising at least two separate, first and second sub-frames each having at least four sides for enclosing said adjacent areas;

each sub-frame having at least three outer side walls extending along three sides of said sub-frame for partially enclosing one of said areas, and a fourth side for extending along said dividing line between the areas; and at least the first sub-frame having a fourth side wall extending along at least part of said fourth side, and the second sub-frame having a gap in said fourth side of length equal to that of said fourth side wall, the fourth side wall comprising means for engagement in the gap in the fourth side of the second sub-frame to form at least part of a dividing wall between the sub-areas enclosed by said sub-frames, the dividing wall being of single wall thickness identical to that of said three side walls.

3. The apparatus as claimed in claim 2, wherein each sub-frame has a fourth partial wall which engages with the partial wall of the other sub-frame to form said dividing wall when the two sub-frames are placed side-by-side.

4. The apparatus as claimed in claim 2, wherein the fourth side wall of the first sub-frame extends across the entire fourth side of the sub-frame, and the fourth side of the second sub-frame is an open side, the two sub-frames being placed side-by-side with the open side of the second sub-frame abutting the fourth side wall of the first sub-frame, whereby the fourth side wall of the first sub-frame forms the dividing wall separating the areas enclosed by the two sub-frames into two separate sub-areas.

5. An EMI shielding apparatus, comprising:

an outer peripheral wall extending around an area of predetermined shape and dimensions for enclosing at least two adjacent sub-areas on a printed wiring board to be shielded from one another, the adjacent areas being separated along a predetermined dividing line, the peripheral wall having opposing portions at opposite ends of said dividing line;

a single transverse wall extending between said opposing portions of the peripheral wall to divide the combined area into said two adjacent sub-areas to be shielded from one another, the transverse wall being of single wall thickness;

the outer peripheral wall and transverse wall being integrally formed as a single frame; and the peripheral wall of the frame having an upper edge and a lower edge and comprising a pair of continuous side walls and a pair of end walls, the frame having an upper, horizontal flat web extending between opposing portions of the upper edges of the side walls, the web having a downturned portion comprising said transverse wall.

6. An EMI shielding apparatus, comprising:

at least two separate, first and second sub-frames each having a plurality of sides for enclosing at least two adjacent sub-areas on a printed wiring board to be shielded from one another, the adjacent areas being separated along a predetermined dividing line;

each sub-frame having at least three outer side walls extending along three sides of said sub-frame for partially enclosing one of said sub-areas, and a fourth side for extending along said dividing line between the sub-areas; and at least the first sub-frames having a fourth side wall extending along at least part of said fourth side, and the second sub-frame having a gap in said fourth side of length equal to that of said fourth side wall, the fourth side wall comprising means for engagement in the gap in the fourth side of the second sub-frame to form at least part of a dividing wall between the sub-areas enclosed by said sub-frames, the dividing wall being of single wall thickness identical to that of said three side walls.

7. The assembly as claimed in claim 6, wherein said fourth side wall extends across the entire length of said fourth side of said first sub-frame to form the entire dividing wall between the areas enclosed by said sub-frames, and said fourth side of said second sub-frame is open to form a gap extending across the entire length of the fourth side for receiving said fourth side wall when the two sub-frames are placed side-by-side to enclose said respective areas.

8. The assembly as claimed in claim 7, wherein the second sub-frame has an upper edge, and a web extending across said open fourth side between opposing upper edge portions of opposite side walls of said second sub-frame.

9. The assembly as claimed in claim 8, wherein said opposite side walls have projecting end portions extending from said web on opposite sides of said open, fourth side wall, and said fourth side wall of said first sub-frame comprises means for extending between outer ends of said projecting end portions across said open side wall.

10. The assembly as claimed in claim 6, wherein the side walls of each sub-frame each have an upper edge, and an inwardly projecting, flat web extending inwardly from each upper edge to form a peripheral rim around the upper edge of each sub-frame.

11. The assembly as claimed in claim 6, wherein each sub-frame has a partial wall extending along only a portion of the fourth side of the sub-frame to leave a gap in said fourth side, the partial wall of each sub-frame comprising means for engagement in the gap in the fourth side of the other sub-frame, whereby said partial walls extend in alignment to form said dividing wall between said sub-areas.

12. The assembly as claimed in claim 11, wherein each partial wall extends across half of the fourth side of the respective sub-frame, the half wall in one sub-frame extending across the opposite half of the fourth side to the half wall in the other sub-frame.

13. The assembly as claimed in claim 11, wherein each sub-frame has a first sidewall extending parallel to said fourth side, and parallel second and third side walls having outer ends, the outer ends of said side walls defining opposite first and second ends of said fourth side of each sub-frame, the partial wall in said first sub-frame extending from the first end of the fourth side and the partial wall in said second sub-frame extending from the second end of the fourth side, the second end of the fourth side of said first sub-frame having a flat end face for abutment with an outer face of the partial wall of the second sub-frame, and the first end of the fourth side wall of the second sub-frame having a flat end face for abutment with an outer face of the partial wall of the first sub-frame.

14. The apparatus as claimed in claim 6, including a cover member for extending over the sub-frames, the cover member having a top wall of shape and dimensions matching the shape and dimensions of the area covered by the sub-frames, and a downturned peripheral rim for engaging over the outer side walls of the sub-frames to hold the sub-frames together during reflow.

* * * * *